(12) United States Patent
Song et al.

(10) Patent No.: US 12,089,450 B2
(45) Date of Patent: Sep. 10, 2024

(54) DISPLAY PANEL AND DISPLAY APPARATUS

(71) Applicant: KunShan Go-Visionox Opto-Electronics Co., Ltd, Jiangsu (CN)

(72) Inventors: Yanqin Song, Kunshan (CN); Weilong Li, Kunshan (CN); Lu Zhang, Kunshan (CN); Siming Hu, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 435 days.

(21) Appl. No.: 17/687,127

(22) Filed: Mar. 4, 2022

(65) Prior Publication Data

US 2022/0190073 A1    Jun. 16, 2022

Related U.S. Application Data

(63) Continuation of application No. PCT/CN2021/075732, filed on Feb. 7, 2021.

(30) Foreign Application Priority Data

Mar. 24, 2020   (CN) .................. 202010214546.2

(51) Int. Cl.
*H10K 59/122* (2023.01)
*H10K 50/842* (2023.01)

(52) U.S. Cl.
CPC ....... *H10K 59/122* (2023.02); *H10K 50/8428* (2023.02)

(58) Field of Classification Search
CPC ............ H10K 59/122; H10K 50/8428; H10K 59/8723; H10K 2102/351; G09F 9/00
See application file for complete search history.

(56) References Cited

U.S. PATENT DOCUMENTS

2015/0357589 A1* 12/2015 Zhu ................... H10K 50/8445
                                                                              428/161
2020/0350388 A1* 11/2020 Song .................. H10K 59/126
(Continued)

FOREIGN PATENT DOCUMENTS

| CN | 105223741 A | 1/2016 |
| CN | 108985248 A | 12/2018 |

(Continued)

OTHER PUBLICATIONS

International Search Report (with English Translation) and Written Opinion mailed Apr. 27, 2021, in corresponding to International Application No. PCT/CN2021/075732, 13 pages.
(Continued)

*Primary Examiner* — Caleb E Henry
(74) *Attorney, Agent, or Firm* — Maier & Maier, PLLC (57) ABSTRACT

A display panel and a display apparatus. The display panel has a first display region and a second display region, wherein a light transmittance of the first display region is greater than a light transmittance of the second display region. The display panel includes: a substrate; a pixel definition layer; and a plurality of first spacers and a plurality of second spacers located on a side of the pixel definition layer away from the substrate. The plurality of first spacers are distributed in the first display region, and the plurality of second spacers are distributed in the second display region.

16 Claims, 5 Drawing Sheets

(56) References Cited

U.S. PATENT DOCUMENTS

| | | | | |
|---|---|---|---|---|
| 2020/0350394 A1* | 11/2020 | Lou | .................. | H10K 59/179 |
| 2020/0403048 A1* | 12/2020 | Zhang | .................. | H10K 50/171 |
| 2021/0134899 A1* | 5/2021 | Peng | .................. | H10K 50/816 |
| 2021/0141304 A1* | 5/2021 | Liu | .................. | C23C 14/0042 |

FOREIGN PATENT DOCUMENTS

| | | |
|---|---|---|
| CN | 109061934 A | 12/2018 |
| CN | 109065588 A | 12/2018 |
| CN | 109307962 A | 2/2019 |
| CN | 109360840 A | 2/2019 |
| CN | 110767831 A | 2/2020 |
| CN | 111129103 A | 5/2020 |
| CN | 111261033 A | 6/2020 |
| CN | 111583818 A | 8/2020 |
| CN | 111968517 A | 11/2020 |

OTHER PUBLICATIONS

The First Office Action for Chinese Application No. 202010214546.2, dated Mar. 31, 2021, 16 pages (including machine-generated English translation).
The Second Office Action for Chinese Application No. 202010214546.2, dated Nov. 17, 2021, 15 pages (including machine-generated English translation).
The Third Office Action for Chinese Application No. 202010214546.2, dated Feb. 18, 2022, 15 pages (including machine-generated English translation).
Office Action issued on May 23, 2022, in connection with corresponding Chinese Application No. 202010214546.2; 6 bages, with partial English translation.

* cited by examiner

DISPLAY PANEL AND DISPLAY APPARATUS

CROSS-REFERENCE TO RELATED APPLICATION

This application is a continuation of International Application No. PCT/CN2021/075732, filed on Feb. 7, 2021, which claims priority to Chinese Patent Application No. 202010214546.2, filed on Mar. 24, 2020, both of which are hereby incorporated by reference in their entireties.

TECHNICAL FIELD

The present application relates to a technical field of display, and in particular to a display panel and a display apparatus.

BACKGROUND

With the rapid development of electronic devices, demands of users for the screen-to-body ratio are higher and higher, resulting in that the full-screen display of electronic devices attracts more and more attention in the industry.

Traditional electronic devices such as a cell phone and a tablet computer needs to integrate a front camera, a telephone receiver, an infrared sensing component and the like. Nevertheless, in the prior art, when the light transmittance of the electronic devices is improved, the intensity of the display panel may be easily deteriorated and the quality of the display panel may be reduced.

SUMMARY

The present application provides a display panel and a display apparatus, which facilitate the under-screen integration of photosensitive components, improve the screen-to-body ratio, and ensure the overall strength of the display panel at the same time.

The embodiments of the present application provide a display panel including a first display region and a second display region, wherein a light transmittance of the first display region is greater than a light transmittance of the second display region, and the display panel includes: a substrate; a pixel definition layer located on the substrate; a plurality of first spacers located on a side of the pixel definition layer away from the substrate, the plurality of first spacers being distributed in the first display region; and a plurality of second spacers located on the side of the pixel definition layer away from the substrate, the plurality of second spacers being distributed in the second display region, wherein a ratio of a total area of orthographic projections of the plurality of first spacers on the substrate to an area of the first display region is smaller than a ratio of a total area of orthographic projections of the plurality of second spacers on the substrate to an area of the second display region, and a ratio of an equivalent size of an orthographic projection of each of the first spacers on the substrate to an equivalent size of an orthographic projection of each of the second spacers on the substrate is 0.5 to 10.

In another aspect, the embodiments of the present application further provide a display apparatus including the display panel as described above.

According to the display panel and the display apparatus in the embodiments of the present application, the light transmittance of the first display region of the display panel is greater than the light transmittance of the second display region, so that in the display panel, the photosensitive components can be integrated on the back side of the first display region, which realizes the under-screen integration of the photosensitive component such as a camera. The display panel includes the substrate, the pixel definition layer, and the first spacers and the second spacers located on the side of the pixel definition layer facing away from the substrate. The first spacers and the second spacers can improve the strength and pressure resistance of the display panel, and keep the display panel away from problems of poor displaying effects such as water waves.

Since the ratio of the total area of the orthographic projections of the first spacers of the first display region on the substrate to the area of the first display region is smaller than the ratio of the total area of the orthographic projections of the second spacers of the second display region on the substrate to the area of the second display region, the influence of the first spacers on the light transmittance can be reduced, which effectively increases the light transmittance of the first display region. Furthermore, the ratio of the equivalent size of the orthographic projection of each of the first spacers on the substrate to the equivalent size of the orthographic projection of each of the second spacers on the substrate is 0.5 to 1. By reasonably setting the ratio of the equivalent size of the orthographic projection of the first spacer on the substrate to the equivalent size of the orthographic projection of the second spacer on the substrate, the improper settings of the equivalent size of the orthographic projection of the first spacer on the substrate may be prevented. For example, the collapse of the first spacer during the manufacturing process caused by the equivalent size of the orthographic projection of the first spacer on the substrate being too small may be prevented, so that the height of the first spacer matches the height of the second spacer.

BRIEF DESCRIPTION OF THE DRAWINGS

Other features, objects, and advantages of the present application will become more apparent from the following detailed description of non-limiting embodiments with reference to the accompanying drawings, in which like or similar reference characters refer to the same or similar features, and the drawings are not necessarily drawn to scale.

DETAILED DESCRIPTION

The features and exemplary embodiments of various aspects of the present application will be described in detail below.

In electronic devices such as mobile phones and tablets, photosensitive components (e.g., front cameras, infrared light sensors, and proximity light sensors) are required to be integrated on the side where display panels are provided. Optionally, light-transmitting display regions may be provided on the above-described electronic devices, and the photosensitive components may be arranged on the back of the light-transmitting display regions, so that full-screen displaying of the electronic devices can be realized with the normal operation of the photosensitive components being ensured.

Generally, the display panel is provided with spacers (SPCs) to improve the overall strength of the display panel, but the arrangement of the spacers may affect the light transmittance of the light-transmitting display region of the display panel. In order to increase the light transmittance of the light-transmitting display region, the size of the spacers will be reduced. Nevertheless, when the size of the spacers is reduced, the spacers may collapse during the manufacturing, which cannot play an effective support role, and may further lead to poor display of the display panel. Therefore, for the display panel, the arrangement of the spacers should be also considered comprehensively in addition to the improvement of the light transmittance of the display panel.

In order to solve the above-mentioned problems, the embodiments of the present application provide a display panel and a display apparatus. The display panel 100 and the display apparatus according to the embodiments of the present application will be described in detail with reference to FIG. 1 to FIG. 9.

Figure 1:
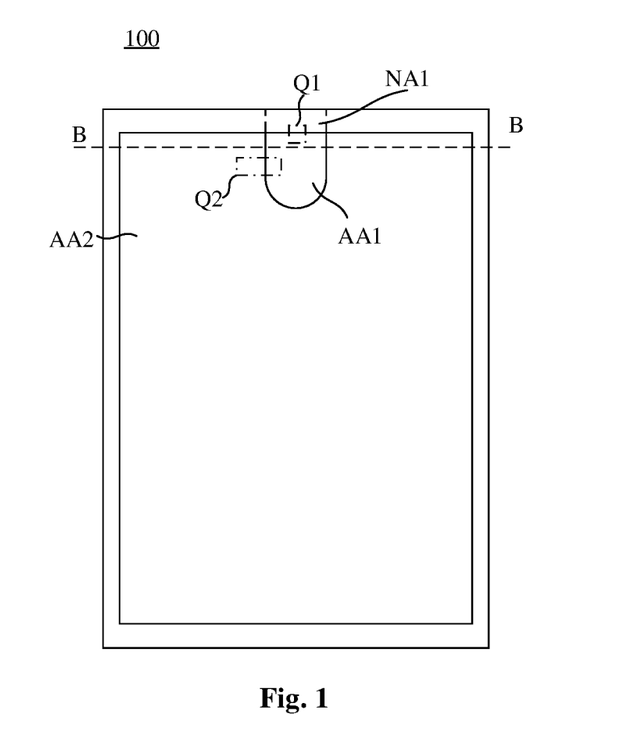
FIG. 1 is a top view of a display panel according to an embodiment of the present application.
Figure 2:
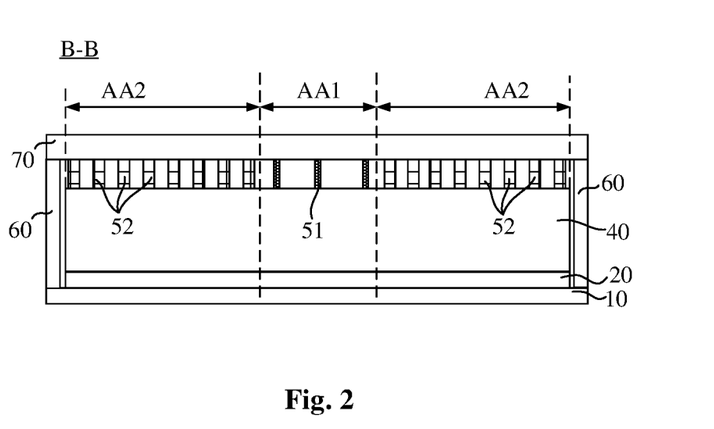
FIG. 2 is a cross-sectional view along a B-B direction in FIG. 1.

Reference is now made to FIGS. 1 and 2. FIG. 1 is a top view of a display panel according to an embodiment of the present application. FIG. 2 is a cross-sectional view along a B-B direction in FIG. 1. The embodiments of the present application provide a display panel 100 including a first display region AA1 and a second display region AA2. The light transmittance of the first display region AA1 is greater than the light transmittance of the second display region AA2.

The display panel 100 includes a substrate 10, a pixel definition layer 40, and a plurality of first spacers 51 located on a side of the pixel definition layer 40 away from the substrate 10 and a plurality of second spacers 52 located on the side of the pixel definition layer 40 away from the substrate 10. The pixel definition layer 40 is located on the substrate 10. Here, the plurality of first spacers 51 are distributed in the first display region AA1, and the plurality of second spacers 52 are distributed in the second display region AA2. A ratio of a total area of orthographic projections of the plurality of first spacers 51 on the substrate 10 to an area of the first display region AA1 is smaller than a ratio of a total area of orthographic projections of the plurality of second spacers 52 on the substrate 10 to an area of the second display region AA2. A ratio of an equivalent size of an orthographic projection of each of the first spacers 51 on the substrate 10 to an equivalent size of an orthographic projection of each of the second spacers 52 on the substrate 10 is 0.5 to 10.

The equivalent size of the orthographic projection of each of the first spacers 51 on the substrate 10 refers to a minimum width between two points arranged oppositely on an outer contour of the orthographic projection of each of the first spacers 51 on the substrate 10. Here, the two points arranged oppositely indicate that the line between the two points passes through the center of the orthographic projection shape. For example, when the outer contour of the orthographic projection of the first spacer 51 on the substrate 10 is circular, the equivalent size is the diameter of the circle; when the outer contour of the orthographic projection of the first spacer 51 on the substrate 10 is elliptical, the equivalent size is the minor axis of the ellipse. By reasonably setting the equivalent size of the orthographic projection of each of the first spacers 51 on the substrate 10, the manufactured height of the first spacer 51 can be effectively controlled. Therefore, the first spacer 51 can be prevented from collapsing caused by the equivalent size being too small, which avoids the mismatch between the height of the first spacer 51 and the height of the second spacer 52. The equivalent size of the orthographic projection of each of the second spacers 52 on the substrate 10 has the same meaning as the equivalent size of the first spacer 51, and will not be repeated.

In this embodiment, the light transmittance of the first display region AA1 may be 15% or more. In order to ensure that the light transmittance of the first display region AA1 is greater than 15%, greater than 40%, or even higher, the light transmittance of at least some of the functional film layers of the display panel 100 in this embodiment is greater than 80%, and the light transmittance of at least some of the functional film layers is even greater than 90%.

By providing the plurality of first spacers 51 in the first display region AA1 and the plurality of second spacers 52 in the second display region AA2, on one hand, the first spacers 51 and the second spacers 52 can prevent the photomask from scratching the prepared films in the display panel 100 when vapor deposition is performed on other film structures of the display panel 100 using the photomask. For example, the first spacers 51 and the second spacers 52 can prevent the photomask from damaging the prepared light-emitting structure when the light-emitting structures of the sub-pixels are prepared. On the other hand, the first spacers 51 and the second spacers 52 can support the display panel 100 and improve the strength of the display panel 100. Here, the constituent material of the first spacers 51 includes, but is not limited to, photosensitive siloxane (PSPD0) or photosensitive polyimide photoresist (PSPI), and the constituent material of the second spacers 52 includes, but is not limited to, photosensitive siloxane or photosensitive polyimide photoresist. The material of the first spacers 51 may be the same as the material of the second spacers 52, and the first spacers 51 and the second spacers 52 may also be manufactured simultaneously, which simplifies the manufacturing process of the display panel 100.

According to the embodiments of the present application, the light transmittance of the first display region AA1 of the display panel 100 is greater than the light transmittance of the second display region AA2 of the display panel 100, so that in the display panel 100, photosensitive components can be integrated on the back side of the first display region AA1, thereby achieving the under-screen integration of the photosensitive components, such as a camera. By setting the ratio of the equivalent size of the orthographic projection of each of the first spacers 51 on the substrate 10 to the equivalent size of the orthographic projection of each of the second spacers 52 on the substrate 10 as 0.5 to 10, the improper settings of the equivalent size of the orthographic projection of the first spacer 51 on the substrate 10 may be prevented. For example, the collapse of the first spacer 51 during the manufacturing process caused by the equivalent size of the orthographic projection of the first spacer 51 on the substrate 10 being too small may be prevented, so that the height of the first spacer 51 matches the height of the second spacer 52. Meanwhile, by reasonably setting the ratio relationship between the equivalent sizes of the first spacers 51 and the equivalent sizes of the second spacers 52, the supporting area of the first spacers 51 in the first display region AA1 and the supporting area of the second spacers 52 in the second display region AA2 can be reasonably set, which makes the compressive strength of the first display region AA1 and the compressive strength of the second display region AA2 tend to be close.

In this embodiment, the height of the first spacer 51 is a size of the first spacer 51 along the thickness direction of the display panel 100, and the height of the second spacer 52 is a size of the second spacer 52 along the thickness direction of the display panel 100. Optionally, the ratio of the equivalent size of the orthographic projection of each of the first spacers 51 on the substrate 10 to the equivalent size of the orthographic projection of each of the second spacers 52 on the substrate 10 is 0.5 to 1. According to the above arrangement, the light transmittance of the first display region AA1 of the display panel 100 can be further improved.

Optionally, the equivalent size of the orthographic projection of each of the first spacers 51 on the substrate 10 is greater than or equal to 8 μm. In a specific implementation, the equivalent size of the orthographic projection of each of the first spacers 51 on the substrate 10 can be set according to user requirements, for example, it can be 8 μm, 9 μm or 10 μm. The equivalent sizes of the orthographic projections of the plurality of first spacers 51 on the substrate 10 may be the same or different, as long as the equivalent sizes of the first spacers 51 are greater than or equal to 8 μm. According to the above arrangement, the first spacers 51 may be prevented from collapsing during the manufacturing process, which avoids the mismatch between the height of the first spacers 51 and the height of the second spacers 52. Therefore, the first display region AA1 may have a uniform pressure resistance, and the display panel 100 may be prevented from problems of poor displaying such as water waves and Newton rings. At the same time, by reasonably setting the equivalent sizes of the first spacers 51, the influence of the equivalent sizes of the first spacers 51 being too large on the light transmittance of the first display region AA1 can also be reduced.

Optionally, the sizes of the first spacers 51 along the thickness direction of the display panel 100 may be greater than or equal to 1 μm. Optionally, the sizes of the second spacers 52 along the thickness direction of the display panel 100 may be greater than or equal to 1 μm. In a specific implementation, the sizes of the first spacers 51 and the second spacers 52 along the thickness direction of the display panel 100 can be set according to the requirements of the user, for example, it can be 1 μm, 1.5 μm, 2.1 μm, 2.2 μm, or 2.3 μm. According to the above arrangement, the height of the first spacers 51 matches the height of the second spacers 52, and problems of poor displaying such as Newton rings can be prevented.

Optionally, under a condition that the equivalent size of the orthographic projection of each of the first spacers 51 on the substrate 10 is greater than or equal to 8 μm, the sizes of the first spacers 51 along the thickness direction of the display panel 100 may be greater than or equal to 2.1 μm during the manufacturing of the display panel. According to the above arrangement, on the basis of reducing the influence on the light transmittance of the first display region AA1, the pressure resistance of the display panel 100 can be improved, and the display quality of the display panel 100 can be further improved.

Optionally, the equivalent size of the orthographic projection of each of the second spacers 52 on the substrate 10 is greater than or equal to 10 μm. According to the above arrangement, the ratio of the total area of the orthographic projections of the second spacers 52 on the substrate 10 to the area of the second display region AA2 can be increased, so that the second spacers 52 can effectively support and protect the second display region AA2.

Optionally, the side of the first spacers 51 facing away from the substrate 10 is flush with the side of the second spacers 52 facing away from the substrate 10 in the thickness direction of the display panel 100. According to the above arrangement, the Newton ring generated by the mismatch between the height of the first spacers 51 and the height of the second spacers 52 may be effectively prevented, and at the same time, the display panel 100 may have a uniform pressure resistance.

Under a condition that the display panel 100 is a rigid display panel 100, the display panel 100 further includes an encapsulation structure 60. The side of the first spacers 51 facing away from the substrate 10, the side of the second spacers 52 facing away from the substrate 10, and the side of the encapsulation structure 60 facing away from the substrate 10 are flush in the thickness direction of the display panel 100. Therefore, the Newton ring generated by the mismatch between the height of the spacers and the height of the encapsulation structure 60 may be effectively prevented.

Optionally, the ratio of the total area of the orthographic projections of the plurality of first spacers 51 on the substrate 10 to the area of the first display region AA1 is 1% to 80% of the ratio of the total area of the orthographic projections of the plurality of second spacers 52 on the substrate 10 to the area of the second display region AA2. According to the above arrangement, the light transmittance of the first display region AA1 may be improved, and the pressure resistance of the first display region AA1 and the second display region AA2 may be balanced.

In order to increase the light transmittance of the first display region AA1, optionally, the ratio of the total area of the orthographic projections of the plurality of first spacers 51 on the substrate 10 to the area of the first display region AA1 is 0.5% to 8%. According to the above arrangement, under a condition that the display panel 100 is a rigid display panel 100, the strength of the rigid display panel 100 may be effectively improved. In a specific implementation, the ratio of the total area of the orthographic projections of the first spacers 51 on the substrate 10 to the area of the first display region AA1 may be 0.5%, 0.6%, 1%, 7%, or 8%. Optionally, the plurality of first spacers 51 are evenly distributed in the first display region AA1, and the plurality of second spacers 52 are evenly distributed in the second display region AA2. According to the above arrangement, the first spacers 51 can be play a function of uniform support in the first display region AA1, and the strength of each position of the first display region AA1 may be increased. At the same time, light can be uniformly transmitted at each position in the first display region AA1. Similarly, the second spacers 52 are uniformly distributed in the second display region AA2, so that the second spacers 52 can play a function of uniform support in the second display region AA2, and the strength of each position of the second display region AA2 may be increased.

Figure 3:
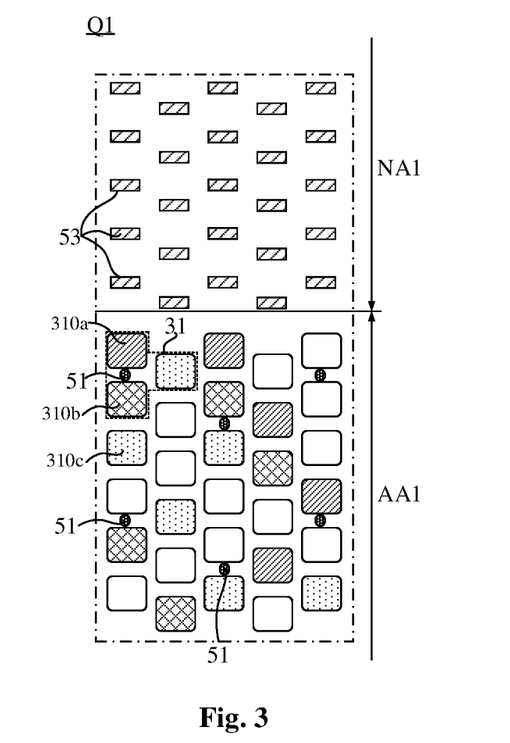
FIG. 3 is an enlarged schematic view of a region Q1 of the display panel shown in FIG. 1.

Referring to FIG. 3, FIG. 3 is an enlarged schematic view of a region Q1 of the display panel shown in FIG. 1. In order to further improve the pressure resistance of the first display region AA1, the display panel 100 further includes a first non-display region NA1 adjacent to the first display region AA1. The display panel 100 further includes a plurality of compensating spacers 53. The plurality of compensating spacers 53 are located on the side of the pixel definition layer 40 facing away from the substrate 10 and are distributed in the first non-display region NA1. A ratio of a total area of the orthographic projections of the plurality of compensating spacers 53 on the substrate 10 to the area of the first non-display region NA1 is greater than or equal to the ratio of the total area of the orthographic projections of the plurality of second spacers 52 on the substrate 10 to the area of the second display region AA2.

Optionally, the compensating spacers 53 may be uniformly distributed in the first non-display region NA1 in order to make the pressure resistance of the display panel 100 uniform at various positions.

In a specific implementation, the ratio of the total area of the orthographic projections of the compensating spacers 53 on the substrate 10 to the area of the first non-display region NA1 is equal to the ratio of the total area of the orthographic projections of the second spacers 52 on the substrate 10 to the area of the second display region AA2, so as to compensate for the problem that the pressure resistance of the first display region AA1 and the pressure resistance of the second display region AA2 are uneven due to the ratio of the total area of the orthographic projections of the first spacers 51 on the substrate 10 to the area of the first display region AA1 being too small.

Optionally, the ratio of the total area of the orthographic projections of the compensating spacers 53 on the substrate 10 to the area of the first non-display region NA1 is greater than the ratio of the total area of the orthographic projections of the second spacers 52 on the substrate 10 to the area of the second display region AA2, so that the compensating spacers 53 can compensate the pressure resistance of the first display region AA1 to a greater extent, so that the pressure resistance of the first display region AA1 approaches the pressure resistance of the second display region AA2.

Optionally, the display panel 100 may further include a second non-display region surrounding the first display region AA1 and the second display region AA2. The arrangement of the spacers in the second non-display region may be set according to the user's requirements, or the spacers may not be arranged in the second non-display region.

Further referring to FIG. 2, optionally, the display panel 100 may further include a cover plate 70. The cover plate 70 is located on the side of the pixel definition layer 40 facing away from the substrate 10. The first spacers 51 and the second spacers 52 play a function of support between the pixel definition layer 40 and the cover plate 70. Optionally, the display panel 100 is a rigid display panel 100. With the above arrangement, the stability and the pressure resistance of the rigid display panel 100 can be effectively improved.

Optionally, the display panel 100 further includes an encapsulation structure 60. The encapsulation structure 60 is arranged between the substrate 10 and the cover plate 70. The encapsulation structure 60 surrounds the first display region AA1 and the second display region AA2, so as to encapsulate the display panel 100 in all directions and improve the display effect and the service life of the display panel 100.

Optionally, the ratio of the total area of the orthographic projections of the plurality of second spacers 52 on the substrate 10 to the area of the second display region AA2 is from 10% to 20%. With the above arrangement, the pressure resistance of the second display region AA2 can be effectively improved, and particularly, when the display panel 100 is a rigid display panel 100 and the display panel 100 includes the cover plate 70, the cover plate 70 can be more effectively supported by the second spacers 52 to improve the strength of the rigid display panel 100. Optionally, the plurality of second spacers 52 are uniformly distributed in the second display region AA2, so that the second display region AA2 has a better uniformity in pressure resistance.

Further, reference is made to FIG. 3. In order to effectively improve the light transmittance of the first display region AA1 of the display panel 100 and avoid the influence of the first spacers 51 on the light transmittance of the first display region AA1, optionally, the shape of the orthographic projection of the first spacer 51 on the substrate 10 includes a curved contour. Optionally, the shapes of the orthographic projections of the first spacers 51 on the substrate 10 include at least one shape selected from a group including a circle shape, an ellipse shape, a dumbbell shape, and a gourd shape. With the above arrangement, the first spacer 51 is made smooth at its boundary, and the influence of the first spacers 51 having unsmooth edges on the transmitted light in the first display region AA1 is prevented. Therefore, the diffraction phenomenon of the first display region AA1 is improved.

Further, the first spacers 51 and the second spacers 52 are arranged in a non-opening area of the pixel definition layer 40, so as to support the display panel 100 and prevent from damaging the light-emitting structures in the sub-pixels.

In the manufacturing process of the display panel 100, the manufactured height of the first spacers 51, the manufactured height of the second spacers 52, and the manufactured height of the compensating spacers 53 should be consistent. Further, the height of the first spacers 51, the height of the second spacers 52, and the height of the compensating spacers 53 on the side of the pixel definition layer away from the substrate 10 should be flush, so as to prevent the height of the spacers from being inconsistent and generating Newton rings.

Figure 4:
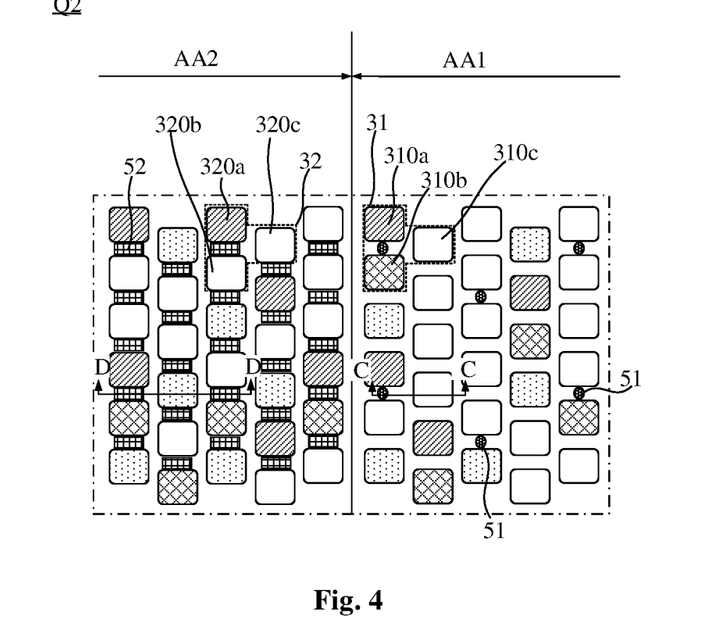
FIG. 4 is an enlarged schematic view of a region Q2 of the display panel shown in FIG. 1.
Figure 5:
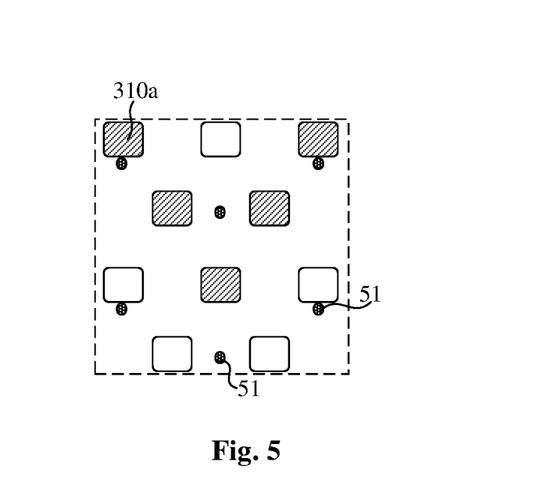
FIG. 5 is a schematic diagram of an example of arrangement of first sub-pixels and first spacers in a first display region of a display panel provided by an embodiment of the present application.
Figure 6:
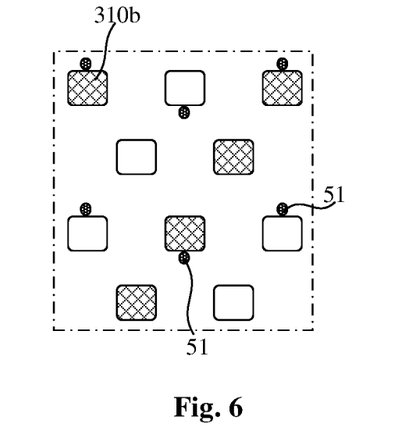
FIG. 6 is a schematic diagram of another example of arrangement of first sub-pixels and first spacers in a first display region of a display panel provided by an embodiment of the present application.
Figure 7:
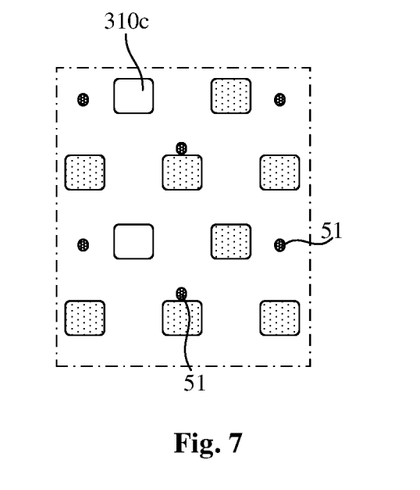
FIG. 7 is a schematic diagram of yet another example of arrangement of first sub-pixels and first spacers in a first display region of a display panel provided by an embodiment of the present application.

Reference is now made to FIGS. 4 to 7. FIG. 4 is an enlarged schematic view of a region Q2 of the display panel shown in FIG. 1. FIG. 5 is a schematic diagram of an example of arrangement of first sub-pixels and first spacers in a first display region of a display panel provided by an embodiment of the present application. FIG. 6 is a schematic diagram of another example of arrangement of first sub-pixels and first spacers in a first display region of a display panel provided by an embodiment of the present application. FIG. 7 is a schematic diagram of yet another example of arrangement of first sub-pixels and first spacers in a first display region of a display panel provided by an embodiment of the present application.

In the manufacturing process of the display panel 100, a mask is usually used to fabricate the film structure of each sub-pixel, and the spacers can also be used to support the mask to prevent the mask from damaging the formed film structure. Optionally, the display panel 100 includes first pixels 31 located in the first display region AA1. The first pixel 31 includes a plurality of first sub-pixels 310a, 310b, and 310c. In order to enable the first spacers 51 to achieve better support effect for the masks which is used for manufacturing the first sub-pixels 310a, the first sub-pixels 310b, and the first sub-pixels 310c, the display panel 100 may include more than two first spacers 51 disposed around each first sub-pixel 310a, each first sub-pixel 310b, and each first sub-pixel 310c. By reasonably setting the position of the first spacers 51, the mask can be effectively supported and the mask can be prevented from damaging the formed film structure.

The display panel 100 further includes second pixels 32 located in the second display region AA2, and the second pixel 32 includes a plurality of second sub-pixels 320a, 320b, and 320c. The plurality of second sub-pixels 320a, 320b, and 320c may be arranged in an array along the column direction of the display panel 100, and the second spacers 52 may be arranged between the second sub-pixels 320a, 320b, and 320c which are arranged in an array along the column direction, so as to improve the support effect of the second spacers 52.

Optionally, the first sub-pixels 310a, 310b, and 310c and the second sub-pixels 320a, 320b, and 320c have different colors. The first sub-pixels 310a, 310b, and 310c may include a red first sub-pixel 310a, a green first sub-pixel 310b, and a blue first sub-pixel 310c. Similarly, the second pixels 32 of the display panel 100 in the second display region AA2 may include a red second sub-pixel 320a, a green second sub-pixel 320b and a blue second sub-pixel 320c.

It should be noted, in FIG. 3 to FIG. 7, sub-pixels of different colors are distinguished by different filling patterns, wherein sub-pixels of the same color are drawn using the same filling pattern. The number and the colors of sub-pixels included in each first pixel 31 or each second pixel 32 may be adjusted according to the design requirements of the display panel 100, and thus are not limited to the examples of the embodiments described above. In addition, the arrangement of the sub-pixels in each first pixel 31 or each second pixel 32 is not limited to the examples of the embodiments described above.

Figure 8:
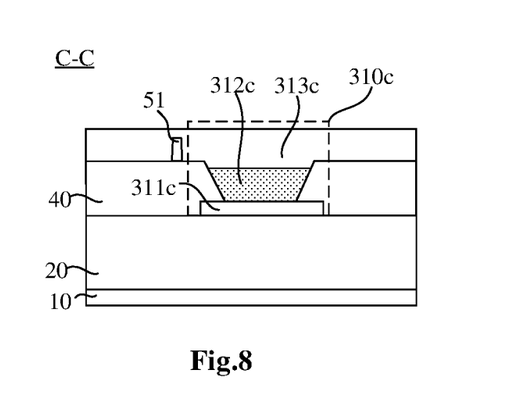
FIG. 8 is a cross-sectional view along a C-C direction in FIG. 4.
Figure 9:
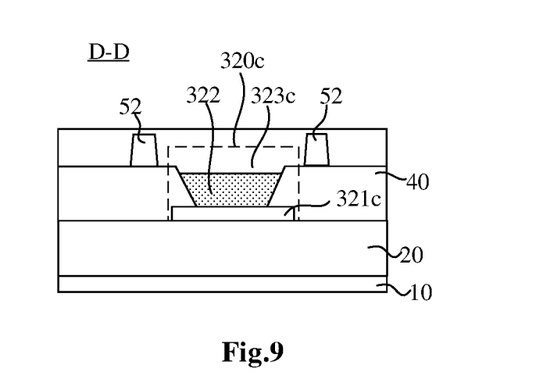
FIG. 9 is a cross-sectional view along a D-D direction in FIG. 4.

Reference is now made to FIG. 8 and FIG. 9. FIG. 8 is a cross-sectional view along a C-C direction in FIG. 4. FIG. 9 is a cross-sectional view along a D-D direction in FIG. 4. Here, the structures of the first sub-pixels 310a, the first sub-pixels 310b, and the first sub-pixels 310c are similar, and the first sub-pixels 310c are taken as an example for description herein. Optionally, the pixel definition layer 40 includes a first pixel opening. The first sub-pixel 310c includes a first light-emitting structure 312c, a first electrode 311c, and a second electrode 313c. The first light-emitting structure 312c is located within the first pixel opening. The first electrode 311c is located on a side of the first light-emitting structure 312c facing to the substrate 10. The second electrode 313c is located on a side of the first light-emitting structure 312c facing away from the substrate 10. The second electrode 313c is arranged to cover the first spacers 51, wherein an organic material can also be arranged between the second electrode 313c and the first spacers 51, which is not limited in the present application. One of the first electrode 311c and the second electrode 313c is an anode and the other one is a cathode.

The structures of the second sub-pixels 320a, 320b, and 320c are similar to the structures of the first sub-pixels 310a, 310b, and 310c. For example, the pixel definition layer 40 further includes a second pixel opening. The second sub-pixel 320c includes a second light-emitting structure 322c, a third electrode 321c and a fourth electrode 323c. The second light-emitting structure 322c is arranged in the second pixel opening. The third electrode 321c is located on a side of the second light-emitting structure 322c facing to the substrate 10. The fourth electrode 323c is located on a side of the second light-emitting structure 322c facing away from the substrate 10. The fourth electrode 323c is arranged to cover the second spacers 52, wherein an organic material can also be arranged between the fourth electrode 323c and the second spacers 52. One of the third electrode 321c and the fourth electrode 323c is an anode, and the other one is a cathode.

In this embodiment, for illustration, the first electrode 311c and the third electrode 321c are taken as anodes, and the second electrode 313c and the fourth electrode 323c are taken as cathodes.

Optionally, in order to improve the light transmittance of the first display region AA1, the first electrode 311c is a light-transmitting electrode. Optionally, the first electrode 311c includes an indium tin oxide (ITO) layer or an indium zinc oxide layer.

Optionally, the first electrode 311c is a reflective electrode, and the area of the orthographic projection of the first electrode 311c on the substrate 10 is smaller than the area of the orthographic projection of the third electrode 321c on the substrate 10. The first electrode 311c may include a first light-transmitting conductive layer, a reflective layer located on the first light-transmitting conductive layer, and a second light-transmitting conductive layer located on the reflective layer. The first light-transmitting conductive layer and the second light-transmitting conductive layer may be ITO, indium zinc oxide and the like. The reflective layer may be a metal layer, for example made of a silver material.

Optionally, the constituent material of the second electrode 313c includes magnesium, silver, or magnesium-silver alloy. The fourth electrode 323c may be configured to use the same material as the second electrode 313c. Optionally, the second electrode 313c and the fourth electrode 323c may be interconnected as a common electrode.

Optionally, the orthographic projection of each first light-emitting structure 312c on the substrate 10 includes one first graphic unit, or includes a splicing of two or more than two first graphic units. The first graphic unit includes at least one shape selected from a group including a circle shape, an ellipse shape, a dumbbell shape, a gourd shape, and a rectangle shape.

Optionally, the orthographic projection of each first electrode 311c on the substrate 10 includes one second graphic unit, or includes a splicing of two or more than two second graphic units. The second graphic unit includes at least one shape selected from a group including a circle shape, an ellipse shape, a dumbbell shape, a gourd shape, and a rectangle shape. With the above arrangement, the diffraction of the first display region AA1 can be effectively reduced.

Optionally, the display panel 100 further includes a device layer 20 located between the substrate 10 and the pixel definition layer 40. The device layer 20 includes a pixel circuit which drives the first sub-pixels 310a, 310b, and 310c and the second sub-pixels 320a, 320b, and 320c to emit light and display.

In summary, according to the display panel 100 and the display apparatus of the embodiments of the present application, the light transmittance of the first display region AA1 of the display panel 100 is greater than the light transmittance of the second display region AA2 of the display panel 100, so that in the display panel 100, the photosensitive components can be integrated on the back side of the first display region AA1, which realizes the under-screen integration of the photosensitive component such as a camera. The display panel 100 includes the substrate 10, the pixel definition layer 40, and the first spacers 51 and the second spacers 52 located on the side of the pixel definition layer 40 away from the substrate 10. The first spacers 51 and the second spacers 52 can improve the strength and pressure resistance of the display panel 100, and keep the display panel 100 away from problems of poor displaying effects such as water waves.

Since the ratio of the total area of the orthographic projections of the first spacers 51 on the substrate 10 to the area of the first display region AA1 is smaller than the ratio of the total area of the orthographic projections of the second spacers 52 on the substrate 10 to the area of the second display region AA2, the influence of the first spacers 51 on the light transmittance can be reduced, which effectively increases the light transmittance of the first display region AA1. Furthermore, the ratio of the equivalent size of the orthographic projection of each of the first spacers 51 on the substrate 10 to the equivalent size of the orthographic projection of each of the second spacers 52 on the substrate 10 is 0.5 to 1. By reasonably setting the ratio of the equivalent size of the orthographic projection of the first spacer 51 on the substrate 10 to the equivalent size of the orthographic projection of the second spacer 52 on the substrate 10, the collapse of the first spacer 51 during the manufacturing process caused by the equivalent size of the orthographic projection of the first spacer 51 on the substrate 10 being too small may be prevented, so that the manufactured height of the first spacer 51 matches the height of the second spacer 52.

In another aspect, the embodiments of the present application further provide a display apparatus including the display panel 100 as described above.

Since the display apparatus according to the embodiments of the present application includes the display panel 100 in any of the above embodiments, the display panel 100 includes the first display region AA1 and the second display region AA2, and the light transmittance of the first display region AA1 is greater than the light transmittance of the second display region AA2. Therefore, the display apparatus according to the embodiments of the present application has the same advantageous effects as the display panel 100 according to the above embodiments, and can not only realize a full-screen display, but also enable the display panel 100 to have a high light transmittance, and facilitate the under-screen integration of components such as photosensitive components.

Optionally, the display panel 100 includes opposite first surface and second surface, wherein the first surface is a surface for display. The display apparatus further includes a photosensitive component positioned on the side of the display panel 100 where the second surface is disposed. The photosensitive component corresponds to the position of the first display region AA1.

The photosensitive component may be an image capture apparatus for capturing external image information. Optionally, the photosensitive component may be a complementary metal oxide semiconductor (CMOS) image capture apparatus. In some other embodiments, the photosensitive component may be a charge-coupled device (CCD) image capture device or other form of image capture device. The photosensitive component may not be limited to an image capture device, for example and optionally, the photosensitive component may be a light sensor such as an infrared sensor, a proximity sensor, an infrared lens, a flood sensing element, an ambient light sensor, and a dot matrix projector. In addition, in the display apparatus, other components may further be integrated on the side of the display panel 100 where the second surface is disposed, such as an earpiece, a speaker, etc.

According to the display apparatus in the embodiments of the present application, the light transmittance of the first display region AA1 is greater than the light transmittance of the second display region AA2, so that in the display panel 100, a photosensitive component can be integrated on the back side of the first display region AA1 to realize under-screen integration of a photosensitive component such as an image acquisition device. At the same time, the first display region AA1 are able to display pictures to increase the display area of the display panel 100 to realize a full-screen design of the display apparatus. Meanwhile, by appropriately setting the first spacers 51 in the first display region AA1 and the second spacers 52 in the second display region AA2, the pressure resistance of the display panel 100 can be ensured, and the creation of Newton's rings can be prevented.

The present application may be implemented in other specific forms without departing from its gist or essential characteristics. The present embodiments are therefore to be considered in all respects as illustrative and not restrictive, the scope of the application being indicated by the appended claims rather than by the foregoing description, and all changes which come within the meaning and range of equivalency of the claims are therefore intended to be embraced therein. Furthermore, the different technical features presented in the different embodiments may be combined in a first combination to achieve advantageous effects. Other variations to the disclosed embodiments can be understood and effected by those skilled in the art in practicing the claimed application, from a study of the drawings, the disclosure, and the appended claims.

What is claimed is:

1. A display panel comprising a first display region and a second display region, wherein a light transmittance of the first display region is greater than a light transmittance of the second display region, and the display panel comprises:
   a substrate;
   a pixel definition layer located on the substrate;
   a plurality of first spacers located on a side of the pixel definition layer away from the substrate, the plurality of first spacers being distributed in the first display region; and
   a plurality of second spacers located on the side of the pixel definition layer away from the substrate, the plurality of second spacers being distributed in the second display region,
   wherein a ratio of a total area of orthographic projections of the plurality of first spacers on the substrate to an area of the first display region is smaller than a ratio of a total area of orthographic projections of the plurality of second spacers on the substrate to an area of the second display region, and a ratio of an equivalent size of an orthographic projection of each of the first spacers on the substrate to an equivalent size of an orthographic projection of each of the second spacers on the substrate is 0.5 to 10.

2. The display panel according to claim 1, wherein the ratio of the equivalent size of the orthographic projection of each of the first spacers on the substrate to the equivalent size of the orthographic projection of each of the second spacers on the substrate is 0.5 to 1.

3. The display panel according to claim 2, wherein the equivalent size of the orthographic projection of each of the first spacers on the substrate is greater than or equal to 8 μm; and a size of each of the first spacers in a thickness direction of the display panel is greater than or equal to 1 μm.

4. The display panel according to claim 1, wherein the equivalent size of the orthographic projection of each of the second spacers on the substrate is greater than or equal to 10 μm.

5. The display panel according to claim 1, wherein a side of the first spacer away from the substrate is flush with a side of the second spacer away from the substrate in a thickness direction of the display panel.

6. The display panel according to claim 1, wherein the ratio of the total area of the orthographic projections of the plurality of first spacers on the substrate to the area of the first display region is 1% to 80% of the ratio of the total area of the orthographic projections of the plurality of second spacers on the substrate to the area of the second display region.

7. The display panel according to claim 1, wherein the ratio of the total area of the orthographic projections of the plurality of first spacers on the substrate to the area of the first display region is 0.5% to 8%.

8. The display panel according to claim 1, wherein the plurality of first spacers are evenly distributed in the first display region, and the plurality of second spacers are evenly distributed in the second display region.

9. The display panel according to claim 1, wherein the display panel further comprises a first non-display region adjacent to the first display region, and the display panel further comprises:

a plurality of compensating spacers located on the side of the pixel definition layer away from the substrate and distributed in the first non-display region, wherein a ratio of a total area of orthographic projections of the plurality of compensating spacers on the substrate to an area of the first non-display region is greater than or equal to the ratio of the total area of the orthographic projections of the plurality of second spacers on the substrate to the area of the second display region.

10. The display panel according to claim 1, wherein a shape of an orthographic projection of the first spacer on the substrate comprises a curved contour.

11. The display panel according to claim 10, wherein the shapes of the orthographic projections of the first spacers on the substrate comprise at least one shape selected from a group comprising a circle shape, an ellipse shape, a dumbbell shape, and a gourd shape.

12. The display panel according to claim 1, wherein the display panel further comprises a cover plate located on the side of the pixel definition layer away from the substrate, and the first spacers and the second spacers are disposed between the pixel definition layer and the cover plate.

13. The display panel according to claim 1, wherein the display panel is a rigid display panel.

14. The display panel according to claim 1, wherein the display panel comprises a plurality of first sub-pixels located in the first display region, and the display panel comprises more than two first spacers disposed around each of the first sub-pixels.

15. The display panel according to claim 1, wherein the pixel definition layer comprises a plurality of first pixel openings and a plurality of second pixel openings, and the display panel further comprises a plurality of first sub-pixels located in the first display region and a plurality of second sub-pixels located in the second display region, each of the first sub-pixels comprises a first light-emitting structure located in the first pixel opening, a first electrode located on a side of the first light-emitting structure facing to the substrate, and a second electrode located on a side of the first light-emitting structure away from the substrate; and the second electrode covers the first spacer, wherein an organic material is disposed between the second electrode and the first spacer, each of the second sub-pixels comprises a second light-emitting structure located in the second pixel opening, a third electrode located on a side of the second light-emitting structure facing to the substrate, and a fourth electrode located on a side of the second light-emitting structure away from the substrate; and the fourth electrode covers the second spacer, wherein an organic material is disposed between the fourth electrode and the second spacer, and the second electrode and the fourth electrode are interconnected as a common electrode.

16. A display apparatus comprising the display panel according to claim 1.

* * * * *